(12) United States Patent
Maeda et al.

(10) Patent No.: US 11,495,475 B2
(45) Date of Patent: Nov. 8, 2022

(54) METHOD OF CLEANING A SUBSTRATE

(71) Applicant: EBARA CORPORATION, Tokyo (JP)

(72) Inventors: Koji Maeda, Tokyo (JP); Hiroshi Shimomoto, Tokyo (JP); Hisajiro Nakano, Tokyo (JP); Masayoshi Imai, Tokyo (JP); Yoichi Shiokawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 382 days.

(21) Appl. No.: 16/780,049

(22) Filed: Feb. 3, 2020

(65) Prior Publication Data

US 2020/0176281 A1 Jun. 4, 2020

Related U.S. Application Data

(62) Division of application No. 14/043,379, filed on Oct. 1, 2013, now abandoned.

(30) Foreign Application Priority Data

Oct. 2, 2012 (JP) ................................. 2012-220613

(51) Int. Cl.
*H01L 21/302* (2006.01)
*H01L 21/67* (2006.01)
(Continued)

(52) U.S. Cl.
CPC ........ *H01L 21/67092* (2013.01); *B24B 37/04* (2013.01); *B24B 37/34* (2013.01);
(Continued)

(58) Field of Classification Search
CPC ............. H01L 21/67051; H01L 21/302; H01L 21/67023
See application file for complete search history.

(56) References Cited

U.S. PATENT DOCUMENTS

| 6,810,888 B2 | 11/2004 | Tsuchiya et al. |
| 2003/0079764 A1* | 5/2003 | Hirose .................... B08B 3/024 134/144 |

(Continued)

FOREIGN PATENT DOCUMENTS

| CN | 101989538 A | 3/2011 |
| JP | H08-318181 A | 12/1996 |

(Continued)

OTHER PUBLICATIONS

Chinese Office action issued in Patent Application No. 201810810886.4 dated Nov. 6, 2019.

(Continued)

*Primary Examiner* — Binh X Tran

(74) *Attorney, Agent, or Firm* — Pearne & Gordon LLP

(57) ABSTRACT

Various methods of cleaning a substrate are provided. In one aspect, method of cleaning a substrate, comprising: holding and rotating a substrate by a substrate holder; and supplying a chemical liquid to a chemical liquid nozzle and supplying two fluids to a two-fluid nozzle while moving the chemical-liquid nozzle and the two-fluid nozzle radially outwardly from the center to the periphery of the substrate, wherein the distance of the chemical-liquid nozzle from a rotating axis of the substrate holder is longer than the distance of the two-fluid nozzle from the rotating axis of the substrate holder while the chemical-liquid nozzle and the two-fluid nozzle are moved radially outwardly from the rotating axis of the substrate holder.

7 Claims, 6 Drawing Sheets

(51) Int. Cl.
   *B24B 37/34* (2012.01)
   *B24B 37/04* (2012.01)
(52) U.S. Cl.
   CPC ...... *H01L 21/302* (2013.01); *H01L 21/67023* (2013.01); *H01L 21/67051* (2013.01); *H01L 21/67219* (2013.01)

(56) References Cited

U.S. PATENT DOCUMENTS

| | | | |
|---|---|---|---|
| 2003/0084925 | A1 | 5/2003 | Nakajima et al. |
| 2004/0045589 | A1* | 3/2004 | Holsteyns ......... H01L 21/67051 257/E21.228 |
| 2004/0206452 | A1 | 10/2004 | Okuda et al. |
| 2007/0131256 | A1 | 6/2007 | Nana et al. |
| 2008/0041420 | A1 | 2/2008 | Sekiguchi et al. |
| 2009/0301518 | A1 | 12/2009 | Oikawa et al. |
| 2010/0122772 | A1 | 5/2010 | Hayashi |
| 2013/0255728 | A1 | 10/2013 | Noh |

FOREIGN PATENT DOCUMENTS

| | | |
|---|---|---|
| JP | H09-171985 A | 6/1997 |
| JP | 2003-092283 A | 3/2003 |
| JP | 2003-209087 A | 7/2003 |
| JP | 2005-032915 A | 2/2005 |
| JP | 2005-086181 A | 3/2005 |
| JP | 2006-286665 A | 10/2006 |
| JP | 2009-246308 A | 10/2009 |
| JP | 2010-238850 A | 10/2010 |
| TW | 561516 B | 11/2003 |
| TW | 2007-41836 A | 11/2007 |
| WO | 2007-108315 A1 | 9/2007 |

OTHER PUBLICATIONS

Minbo, Tian, "Brief Introduction to Integrated Circuit (IC) Process", Tsinghua University Press, Beijing, Dec. 31, 2009, pp. 136-137.

* cited by examiner

METHOD OF CLEANING A SUBSTRATE

CROSS REFERENCE TO RELATED APPLICATION

This is a division of U.S. patent application Ser. No. 14/043,379 filed on Oct. 1, 2013. This application claims priority to Japanese Patent Application No. 2012-220613 filed Oct. 2, 2012, the entire contents of which are hereby incorporated by reference.

BACKGROUND OF THE INVENTION

Field of the Invention

The present invention relates to a substrate cleaning apparatus for cleaning a substrate, such as a wafer, and more particularly to a substrate cleaning apparatus for cleaning a substrate by supplying fluid onto a surface of the substrate. The present invention also relates to a polishing apparatus provided with such a substrate cleaning apparatus.

Description of the Related Art

A polishing apparatus, which is typified by a CMP (chemical mechanical polishing) apparatus, polishes a surface of a wafer by providing sliding contact between the wafer and a polishing pad while supplying a polishing liquid (i.e., slurry) onto the polishing pad. The polishing liquid, which contains abrasive grains therein, and polishing debris remain on the polished surface of the wafer. Thus, after polishing of the wafer, cleaning of the polished wafer is performed.

As disclosed in WO2007/108315 and Japanese laid-open patent publication No. 2003-92283, a conventional cleaning apparatus is typically configured to supply an etching liquid onto a surface of a wafer to etch the surface and then rinse the surface of the wafer with a rinsing liquid to remove the etching liquid that is left on the wafer. However, since the etching process and the rinsing process are performed separately, it takes a long time to complete the cleaning of wafer as a whole. As a result, a throughput is lowered.

SUMMARY OF THE INVENTION

The present invention has been made in order to solve the above issue. It is therefore an object of the present invention to provide a substrate cleaning apparatus capable of efficiently cleaning a substrate, such as a wafer.

In order to achieve the object, one aspect of the present invention provides a substrate cleaning apparatus, including: a substrate holder for holding and rotating a substrate; a chemical liquid nozzle for supplying a chemical liquid onto the substrate; a two-fluid nozzle for supplying a two-fluid jet onto the substrate; and a moving mechanism for moving the chemical liquid nozzle and the two-fluid nozzle together from a center to a periphery of the substrate, wherein the chemical liquid nozzle and the two-fluid nozzle are adjacent to each other with a predetermined distance therebetween, and the chemical liquid nozzle is located forward of the two-fluid nozzle with respect to a movement direction of the chemical liquid nozzle and the two-fluid nozzle.

In a preferred aspect of the present invention, the moving mechanism includes: an arm for holding the chemical liquid nozzle and the two-fluid nozzle; and an arm rotating device for causing the arm to pivot.

In a preferred aspect of the present invention, a movement speed of the chemical liquid nozzle and the two-fluid nozzle is lowered gradually as the chemical liquid nozzle and the two-fluid nozzle approach the periphery of the substrate.

Another aspect of the present invention provides a polishing apparatus, including: a polishing section for polishing a substrate; and the substrate cleaning apparatus for cleaning the polished substrate.

According to the present invention, the chemical liquid can remove foreign matters from the surface of the substrate by the etching action of the chemical liquid, and immediately after the removal of the foreign matters, the two-fluid jet can wash away the chemical liquid and the removed foreign matters from the surface of the substrate. Therefore, etching and rinsing of the substrate can be completed by moving the chemical liquid nozzle and the two-fluid nozzle from the center to the periphery of the substrate only one time. As a result, a time required for cleaning the substrate in its entirety is shortened and a throughput is improved.

DETAILED DESCRIPTION

Figure 1:
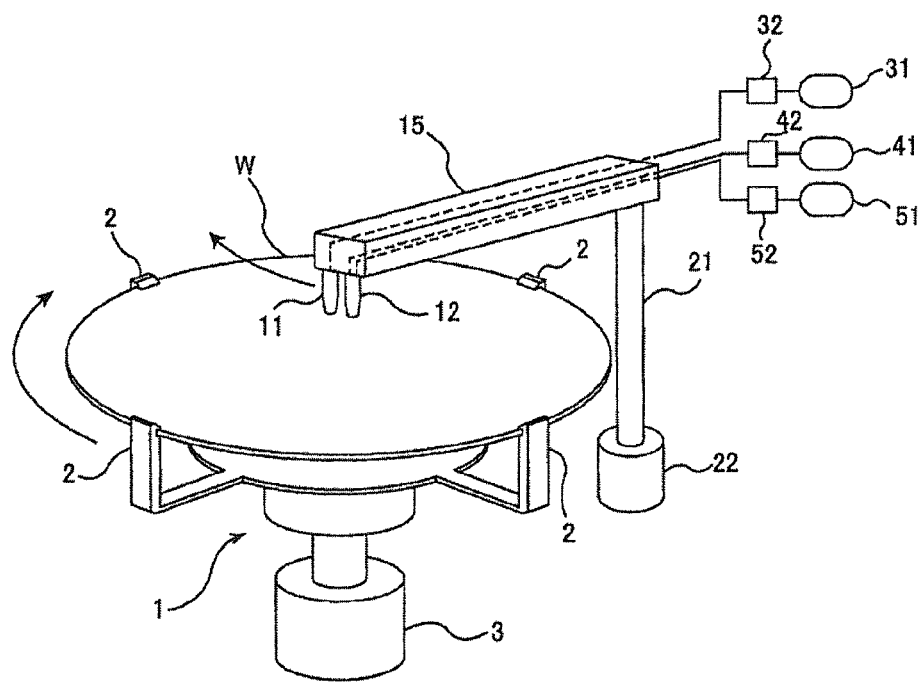
FIG. 1 is a schematic view showing an embodiment of a substrate cleaning apparatus according to the present invention.

An embodiment of a substrate cleaning apparatus according to the present invention will be described with reference to the drawings. FIG. 1 is a schematic view showing an embodiment of the substrate cleaning apparatus according to the present invention. In FIG. 1, a wafer is depicted as a substrate. As shown in FIG. 1, the substrate cleaning apparatus has a substrate holder 1 for holding and rotating a wafer W, a chemical liquid nozzle 11 and a two-fluid nozzle 12 arranged above the wafer W held by the substrate holder 1, and an arm 15 holding the chemical liquid nozzle 11 and the two-fluid nozzle 12.

The substrate holder 1 has a plurality of (four in FIG. 1) chucks 2 for holding a periphery of the wafer W. The wafer W is held horizontally by these chucks 2. A rotational motor 3 is coupled to the chucks 2, so that the wafer W, held by the chucks 2, is rotated about its axis by the rotational motor 3. The chucks 2 shown in FIG. 1 are claw-shaped chucks. Instead of this type, roller-type chucks may be used.

The arm 15 is arranged above the wafer W. The chemical liquid nozzle 11 and the two-fluid nozzle 12 are provided on one end of the arm 15 such that the chemical liquid nozzle 11 and the two-fluid nozzle 12 are adjacent to each other. The other end of the arm 15 is coupled to a pivot shaft 21. This pivot shaft 21 is coupled to a motor 22 serving as an arm rotating device for causing the arm 15 to pivot. This arm rotating device may include, in addition to the motor 22, reducing gears. The motor 22 is configured to rotate the pivot shaft 21 through a predetermined angle to thereby cause the arm 15 to pivot in a plane which is parallel to the wafer W. Therefore, as the arm 15 pivots, the chemical liquid nozzle 11 and the two-fluid nozzle 12 are moved outwardly in a radial direction of the wafer W. In this embodiment, the arm 15, the pivot shaft 21, and the motor 22 constitute a moving mechanism for moving the chemical liquid nozzle 11 and the two-fluid nozzle 12 together from a center to the periphery of the wafer W.

The chemical liquid nozzle 11 is coupled to a chemical liquid supply unit 31 via a flow control valve 32. The chemical liquid supply unit 31 stores therein a chemical liquid (i.e., an etching liquid) that has an etching action on a film formed on the wafer W. The chemical liquid is supplied from the chemical liquid supply unit 31 to the chemical liquid nozzle 11, and then supplied onto an upper surface of the wafer W from the chemical liquid nozzle 11. A flow rate of the chemical liquid supplied to the wafer W is controlled by the flow control valve 32. Examples of the chemical liquid to be used include an acid solution, such as sulfuric acid, and an alkaline solution, such as ammonia. In order to accelerate the etching action, a high-temperature chemical liquid may be used. For example, a chemical liquid ranging from an ordinary temperature to 100° C. may be used.

The two-fluid nozzle 12 is coupled to a liquid supply unit 41 via a flow control valve 42 and is further coupled to a gas supply unit 51 via a flow control valve 52. The liquid supply unit 41 stores therein a liquid (a functional water), such as pure water, carbonated water, or ozone water. The gas supply unit 51 stores therein a gas, such as an inert gas which is typified by nitrogen gas. The liquid and the gas are supplied to the two-fluid nozzle 12 from the liquid supply unit 41 and the gas supply unit 51, respectively, and are mixed with each other in this two-fluid nozzle 12 to form a two-fluid jet. This two-fluid jet is supplied onto the upper surface of the wafer W. A flow rate of the two-fluid jet supplied to the wafer W is controlled by the flow control valves 42, 52. Further, flow rates of the liquid and the gas supplied to the two-fluid nozzle 12 are controlled independently by the corresponding flow control valves 42, 52.

Figure 2:
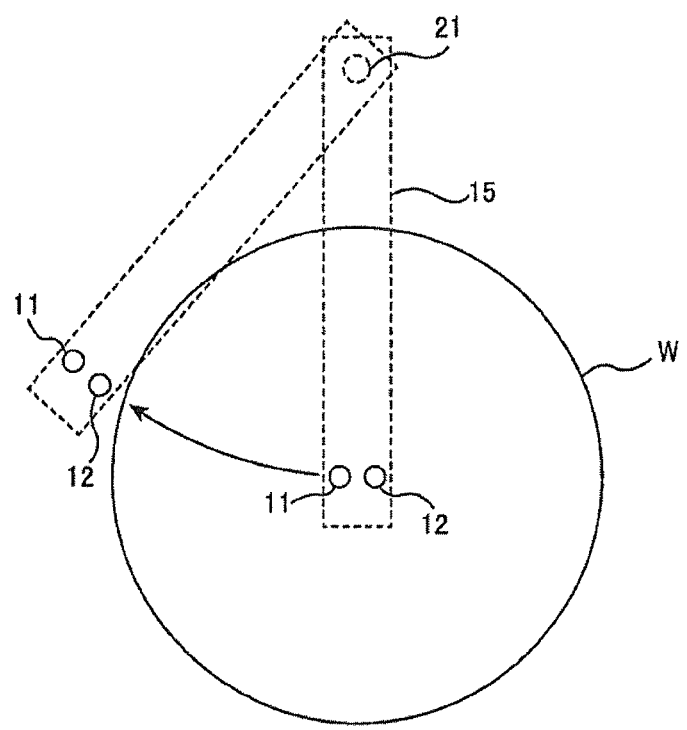
FIG. 2 is a plan view illustrating an arrangement of a chemical liquid nozzle and a two-fluid nozzle.

FIG. 2 is a plan view illustrating an arrangement of the chemical liquid nozzle 11 and the two-fluid nozzle 12. The chemical liquid nozzle 11 and the two-fluid nozzle 12 are adjacent to each other with a predetermined distance therebetween. For example, the distance between the chemical liquid nozzle 11 and the two-fluid nozzle 12 is in a range of 20 mm to 30 mm. As indicated by arrow shown in FIG. 2, the chemical liquid nozzle 11 and the two-fluid nozzle 12 are moved together from the center to the periphery of the wafer W. The chemical liquid nozzle 11 is located forward of the two-fluid nozzle 12 with respect to a movement direction of the chemical liquid nozzle 11 and the two-fluid nozzle 12. Therefore, the two-fluid nozzle 12 follows the chemical liquid nozzle 11 in the same path as the chemical liquid nozzle 11.

Figure 3:
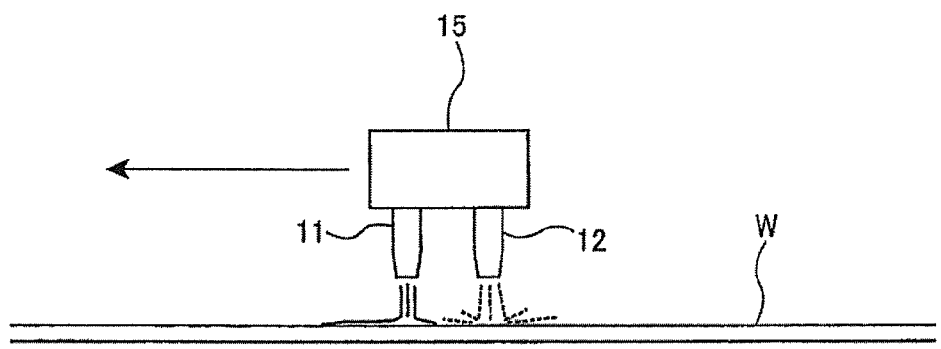
FIG. 3 is a side view of the chemical liquid nozzle and the two-fluid nozzle.

FIG. 3 is a side view of the chemical liquid nozzle 11 and the two-fluid nozzle 12. The chemical liquid nozzle 11 and the two-fluid nozzle 12 are moved in the radial direction of the wafer W as indicated by arrow, while supplying the chemical liquid (i.e., the etching liquid) and the two-fluid jet onto the upper surface of the wafer W, respectively. While being supplied with the chemical liquid and the two-fluid jet, the wafer W is rotated at a predetermined speed by the substrate holder 1. Therefore, the chemical liquid and the two-fluid jet are supplied onto the surface of the wafer W in its entirety.

The chemical liquid that has been supplied onto the wafer W removes foreign matters from the surface of the wafer W by its etching action, and immediately after that, the two-fluid jet washes away the chemical liquid and the foreign matters from the wafer W. According the present invention, etching and rinsing of the wafer W can be completed by moving the chemical liquid nozzle 11 and the two-fluid nozzle 12 from the center to the periphery of the wafer W only one time. As a result, a time required for cleaning the wafer W in its entirety is shortened and a throughput is improved.

In order to evenly supply the chemical liquid to the surface of the wafer W in its entirety, it is preferable to gradually lower the movement speed of the chemical liquid nozzle 11 and the two-fluid jet, as these nozzles 11, 12 approach the periphery of the wafer W. The distance between the chemical liquid nozzle 11 and the two-fluid nozzle 12 and the movement speed of these nozzles 11, 12 are preferably such that the foreign matters are removed sufficiently by the etching action of the chemical liquid.

Figure 4A:
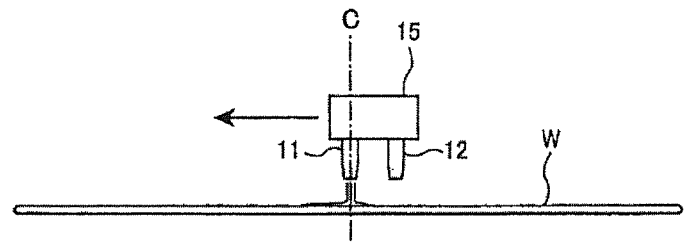
FIGS. 4A, 4B, 4C, 4D and 4E are diagrams illustrating in detail an example of a process of cleaning a wafer using the chemical liquid nozzle and the two-fluid nozzle.
Figure 4B:
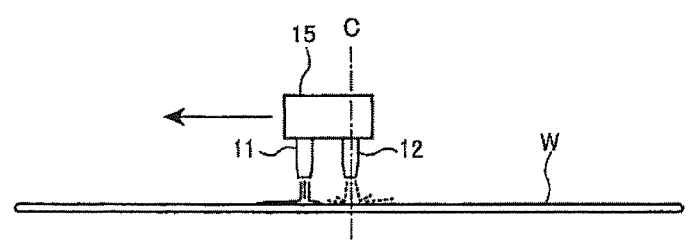
Figure 4C:
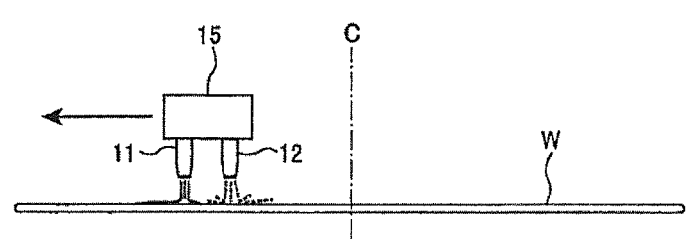

FIG. 4A through FIG. 4E are diagrams illustrating in detail an example of a process of cleaning the wafer using the chemical liquid nozzle 11 and the two-fluid nozzle 12. As shown in FIG. 4A, with the chemical liquid nozzle 11 located on a central axis C of the wafer W, the supply of the chemical liquid (i.e., the etching liquid) is started. Simultaneously, the chemical liquid nozzle 11 and the two-fluid nozzle 12 are started to move toward the periphery of the wafer W. Subsequently, as shown in FIG. 4B, when the two-fluid nozzle 12 is located on the central axis C of the wafer W, the supply of the two-fluid jet is started. As shown in FIG. 4C, the chemical liquid nozzle 11 and the two-fluid nozzle 12 are moved toward the periphery of the wafer W at a constant speed or varying speeds, while supplying the chemical liquid and the two-fluid jet onto the upper surface of the wafer W.

Figure 4D:
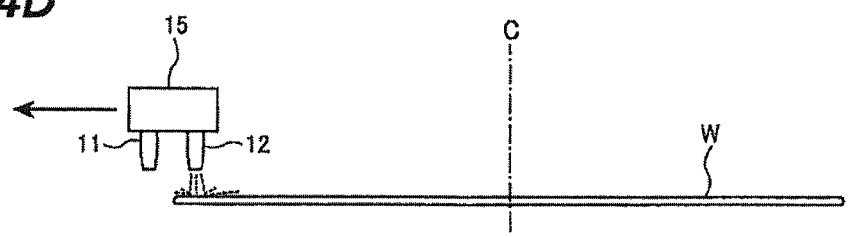
Figure 4E:
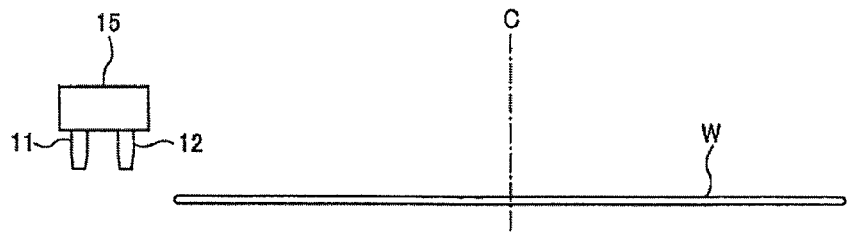

As shown in FIG. 4D, when the chemical liquid nozzle 11 is moved to the outside of the periphery of the wafer W, the supply of the chemical liquid is stopped. Further, as shown in FIG. 4E, when the two-fluid nozzle 12 is moved to the outside of the periphery of the wafer W, the supply of the two-fluid jet is stopped.

FIG. 4A through FIG. 4D show an example in which the supply of the chemical liquid and the supply of the two-fluid jet are started at different times and are stopped at different times. In another example, the supply of the chemical liquid and the supply of the two-fluid jet may be started at the same time and/or may be stopped at the same time.

Figure 5:
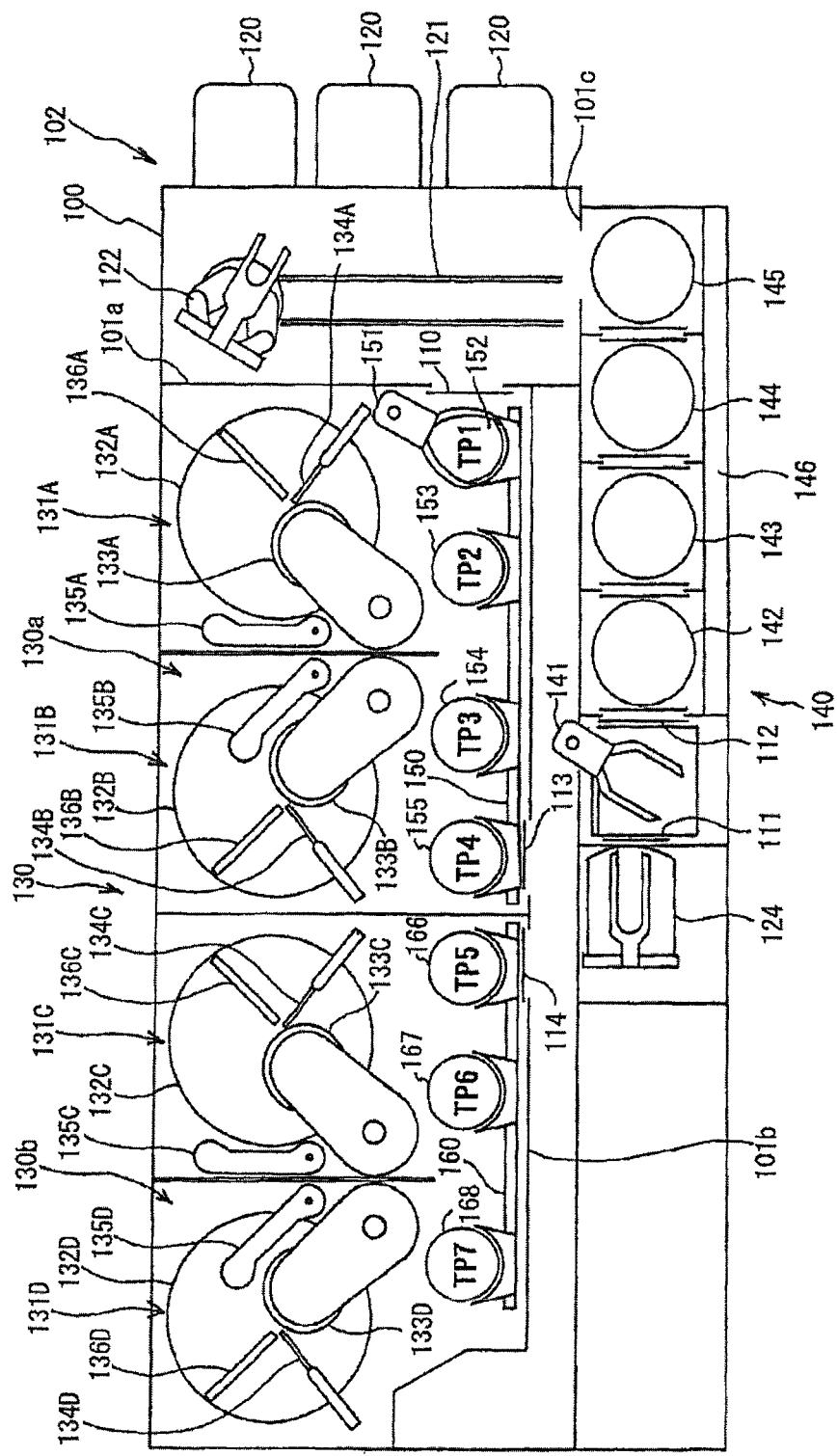
FIG. 5 is a view of a polishing apparatus having the substrate cleaning apparatus.

FIG. 5 is a view showing a polishing apparatus provided with the substrate cleaning apparatus discussed above. As shown in FIG. 5, the polishing apparatus has a housing 100 in a substantially rectangular form. An interior space of the housing 100 is divided into a loading and unloading section 102, a polishing section 130, and a cleaning section 140 by partition walls 101a, 101b, 101c.

The loading and unloading section 102 has two or more front loaders 120 (e.g., three front loaders in FIG. 5) on which wafer cassettes, each storing a plurality of wafers therein, are placed. Each of the front loaders 120 can receive thereon an open cassette, an SMIF (Standard Manufacturing Interface) pod, or a FOUP (Front Opening Unified Pod). The SMIF and FOUP are a hermetically sealed container which houses a wafer cassette therein and is covered with a partition wall to provide an interior environment isolated from an external space.

A moving mechanism 121, extending along an arrangement direction of the front loaders 120, is provided in the loading and unloading section 102. A first transfer robot 122 is provided on the moving mechanism 121. This first transfer robot 122 is movable along the direction in which the front loaders 120 are arranged. The first transfer robot 122 can reach the wafer cassettes placed on the front loaders 120 by moving on the moving mechanism 121. The first transfer robot 122 has two hands (i.e., an upper hand and a lower hand) and can use the two hands differently, for example, by using the upper hand when returning a polished wafer to the wafer cassette and using the lower hand when transferring an unpolished wafer.

The polishing section 130 is an area where a wafer is polished. The polishing section 130 includes a first polishing section 130a having a first polishing unit 131A and a second polishing unit 131B therein, and a second polishing section 130b having a third polishing unit 131C and a fourth polishing unit 131D therein. The first polishing unit 131A, the second polishing unit 131B, the third polishing unit 131C, and the fourth polishing unit 131D are arranged along the longitudinal direction of the polishing apparatus, as shown in FIG. 5.

The first polishing unit 131A includes a polishing table 132A holding a polishing pad thereon, a top ring 133A for holding a wafer and pressing the wafer against a polishing surface of the polishing pad on the polishing table 132A, a polishing liquid supply nozzle 134A for supplying a polishing liquid (e.g., a slurry) or a dressing liquid (e.g., pure water) onto the polishing surface of the polishing pad, a dresser 135A for dressing the polishing pad, and an atomizer 136A having nozzles for ejecting a mixture of a liquid (e.g., pure water) and a gas (e.g., nitrogen) in an atomized state to the polishing surface.

Similarly, the second polishing unit 131B includes a polishing table 132B, a top ring 133B, a polishing liquid supply nozzle 134B, a dresser 135B, and an atomizer 136B. The third polishing unit 131C includes a polishing table 132C, a top ring 133C, a polishing liquid supply nozzle 134C, a dresser 135C, and an atomizer 136C. The fourth polishing unit 131D includes a polishing table 132D, a top ring 133D, a polishing liquid supply nozzle 134D, a dresser 135D, and an atomizer 136D.

Figure 6:
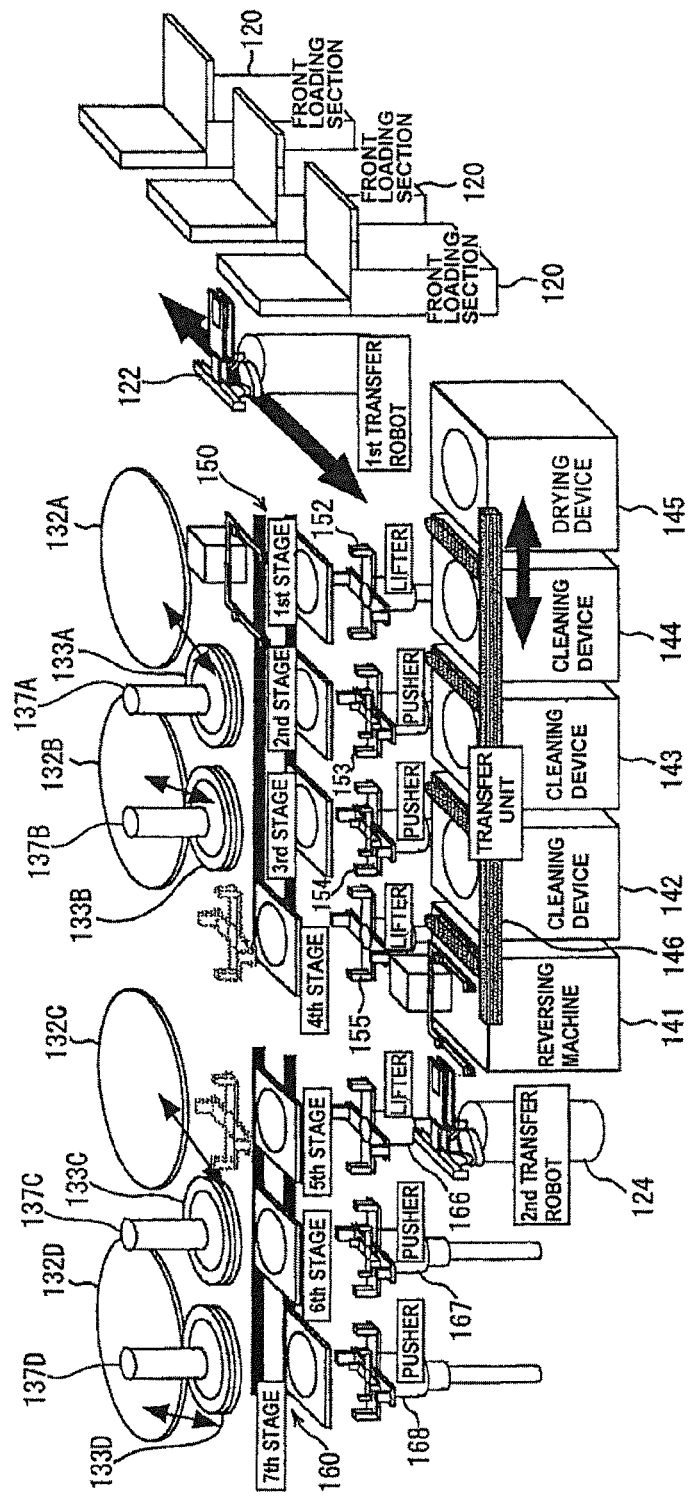
FIG. 6 is a perspective view schematically showing the polishing apparatus shown in FIG. 5.

The polishing pad (not shown) is mounted on the polishing table 132A. The polishing table 132A is coupled to a motor (not shown) disposed below the polishing table 132A. Thus, the polishing table 132A is rotatable about its axis. As shown in FIG. 6, the top ring 133A is coupled via a top ring shaft 137A to a motor and a lifting cylinder (not shown). Thus, the top ring 133A is vertically movable and rotatable about the top ring shaft 137A. The wafer is held on the lower surface of the top ring by, e.g., vacuum suction. An upper surface of the polishing pad constitutes a polishing surface for polishing the wafer.

The top ring 133A, which holds the wafer on its lower surface and rotates the wafer, presses the wafer against the polishing pad on the rotating polishing table 132A. A polishing liquid is supplied onto the polishing surface (upper surface) of the polishing pad from the polishing liquid supply nozzle 134A. Thus, the wafer is polished in the presence of the polishing liquid between the wafer and the polishing pad. The polishing table 132A and the top ring 133A constitute a mechanism for moving the wafer and the polishing surface relative to each other. Each of the second polishing unit 131B, the third polishing unit 131C, and the fourth polishing unit 131D has the same construction as the first polishing unit 131A, and therefore the descriptions thereof are omitted.

A first linear transporter 150 is provided in the first polishing section 130a. This first linear transporter 150 is configured to transfer a wafer between four transferring positions located along the longitudinal direction of the polishing apparatus, i.e., a first transferring position TP1, a second transferring position TP2, a third transferring position TP3, and a fourth transferring position TP4. A reversing machine 151 for reversing a wafer transferred from the first transfer robot 122 is disposed above the first transferring position TP1 of the first linear transporter 150. A vertically movable lifter 152 is disposed below the first transferring position TP1. A vertically movable pusher 153 is disposed below the second transferring position TP2, a vertically movable pusher 154 is disposed below the third transferring position TP3, and a vertically movable lifter 155 is disposed below the fourth transferring position TP4.

In the second polishing section 130b, a second linear transporter 160 is provided next to the first linear transporter 150. This second linear transporter 160 is configured to transfer a wafer between three transferring positions located along the longitudinal direction of the polishing apparatus, i.e., a fifth transferring position TP5, a sixth transferring position TP6, and a seventh transferring position TP7. A vertically movable lifter 166 is disposed below the fifth transferring position TP5 of the second linear transporter 160, a pusher 167 is disposed below the sixth transferring position TP6, and a pusher 168 is disposed below the seventh transferring position TP7, respectively.

As shown in FIG. 6, the first linear transporter 150 has four transfer stages: a first stage, a second stage, a third stage, and a fourth stage, which are linearly movable in a reciprocating manner. These stages have a two-line structure including an upper line and a lower line. Specifically, the first stage, the second stage and the third stage are disposed on the lower line, and the fourth stage is disposed on the upper line.

The lower and upper stages can freely move without interfering with each other, because they are provided at different heights. The first stage transfers a wafer between the first transferring position TP1, and the second transferring position TP2, which is a wafer receiving/delivering position. The second stage transfers a wafer between the second transferring position TP2 and the third transferring position TP3, which is a wafer receiving/delivering position. The third stage transfers a wafer between the third transferring position TP3 and the fourth transferring position TP4. The fourth stage transfers wafer between the first transferring position TP1 and the fourth transferring position TP4.

The second linear transporter 160 has substantially the same structure as the first linear transporter 150. Specifically, the fifth stage and the sixth stage are disposed on an upper line, whereas the seventh stage is disposed on a lower line. The fifth stage transfers a wafer between the fifth transferring position TP5 and the sixth transferring position TP6, which is a wafer receiving/delivering position. The sixth stage transfers a wafer between the sixth transferring position TP6 and the seventh transferring position TP7, which is a wafer receiving/delivering position. The seventh stage transfers a wafer between the fifth transferring position TP5 and the seventh transferring position TP7.

The cleaning section 140 is an area where a polished wafer is cleaned and dried. The cleaning section 140 includes a second transfer robot 124, a reversing machine 141 for reversing a wafer transferred from the second transfer robot 124, three cleaning units 142-144 each for cleaning a polished wafer, a drying unit 145 for drying the cleaned wafer, and a transfer unit 146 for transferring a wafer between the reversing machine 141, the cleaning units 142-144, and the drying unit 145.

The transfer unit 146 has a plurality of arms for gripping the wafers. The wafers gripped by the arms of the transfer unit 146 are transferred between the reversing machine 141, the cleaning units 142-144, and the drying unit 145 simultaneously in a horizontal direction. The cleaning unit 142 and the cleaning unit 143 may be, for example, a roll type cleaning unit which rotates and presses upper and lower roll-shaped sponges against front and rear surfaces of a wafer to clean the front and rear surfaces of the wafer. The cleaning unit 144 is the substrate cleaning apparatus according to the above-described embodiment shown in FIG. 1. The drying unit 145 is a spin drying machine for drying the cleaned wafer by rotating the cleaned wafer at high speed.

A shutter 110 is provided between the reversing machine 151 and the first transfer robot 122. When transferring a wafer, the shutter 110 is opened, and the wafer is delivered between the first transfer robot 122 and the reversing machine 151. Shutters 111, 112, 113, and 114 are disposed between the reversing machine 141 and the second transfer robot 124, between the reversing machine 141 and the primary cleaning unit 142, between the first polishing section 130a and the second transfer robot 124, and between the second polishing section 130b and the second transfer robot 124, respectively. For transferring wafers, the shutters 111, 112, 113, and 114 are opened, and a wafer is delivered.

The polishing apparatus shown in FIG. 5 can perform a series of processes including polishing, cleaning, and drying of the wafer.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A method of cleaning a substrate, comprising:
    holding and rotating a substrate by a substrate holder; and
    starting a supply of a chemical liquid to a chemical-liquid nozzle when the chemical-liquid nozzle is located on a rotating axis of the substrate while moving the chemical-liquid nozzle and a two-fluid nozzle radially outwardly from the center to the periphery of the substrate; and then
    starting a supply of two fluids to the two-fluid nozzle when the two-fluid nozzle is located on the rotating axis of the substrate while moving the chemical-liquid nozzle and the two-fluid nozzle radially outwardly from the center to the periphery of the substrate,
    wherein the distance of the chemical-liquid nozzle from a rotating axis of the substrate holder is longer than the distance of the two-fluid nozzle from the rotating axis of the substrate holder while the chemical-liquid nozzle and the two-fluid nozzle are moved radially outwardly from the rotating axis of the substrate holder.

2. The method according to claim 1, wherein moving the chemical-liquid nozzle and the two-fluid nozzle radially outwardly from the center to the periphery of the substrate comprises moving the chemical-liquid nozzle and the two-fluid nozzle in the same path radially outwardly from the center to the periphery of the substrate.

3. The method according to claim 1, wherein moving the chemical-liquid nozzle and the two-fluid nozzle radially outwardly from the center to the periphery of the substrate comprises moving the chemical-liquid nozzle and the two-fluid nozzle radially outwardly from the center to the periphery of the substrate, with moving speeds of the chemical-liquid nozzle and the two-fluid nozzle gradually lowered.

4. The method according to claim 1, wherein the chemical liquid comprises an etching liquid having a temperature in a range of room temperature to 100° C.

5. The method according to claim 1, wherein cleaning of the substrate is performed using a substrate cleaning apparatus comprising:
    the substrate holder configured to hold and rotate the substrate;
    the chemical-liquid nozzle configured to supply the chemical liquid onto the substrate;
    a chemical liquid supply unit coupled to the chemical-liquid nozzle;
    the two-fluid nozzle configured to supply the two-fluid jet onto the substrate, the two-fluid jet comprising a mixture of a gas and a liquid;
    a liquid supply unit coupled to the two-fluid nozzle;
    a gas supply unit coupled to the two-fluid nozzle; and
    a moving mechanism configured to move the chemical-liquid nozzle and the two-fluid nozzle together in the same path from the center to the periphery of the substrate.

6. A method of cleaning a substrate, comprising:
    holding and rotating a substrate;
    starting a supply of a chemical liquid from a chemical-liquid nozzle to a surface of the substrate when the chemical-liquid nozzle is located on a rotating axis of the substrate to remove foreign matters from the substrate while moving the chemical-liquid nozzle and a two-fluid nozzle radially outwardly from the center to the periphery of the substrate; then
    starting a supply of a two-fluid jet from the two-fluid nozzle to the surface of the substrate when the two-fluid nozzle is located on the rotating axis of the substrate to remove the foreign matters and the chemical liquid from the substrate while moving the chemical-liquid nozzle and the two-fluid nozzle radially outwardly from the center to the periphery of the substrate, the two-fluid jet comprising a mixture of a gas and a liquid;
    stopping the supply of the chemical liquid when the chemical-liquid nozzle moves outwardly of the periphery of the substrate; and then
    stopping the supply of the two-fluid jet to terminate cleaning of the substrate when the two-fluid nozzle moves outwardly of the periphery of the substrate.

7. The method according to claim 6, wherein cleaning of the substrate is performed using a substrate cleaning apparatus comprising:
    a substrate holder configured to hold and rotate the substrate;
    the chemical-liquid nozzle configured to supply the chemical liquid onto the substrate;
    a chemical liquid supply unit coupled to the chemical-liquid nozzle;
    the two-fluid nozzle configured to supply the two-fluid jet onto the substrate;
    a liquid supply unit coupled to the two-fluid nozzle;
    a gas supply unit coupled to the two-fluid nozzle; and
    a moving mechanism configured to move the chemical-liquid nozzle and the two-fluid nozzle together in the same path from the center to the periphery of the substrate.

* * * * *